United States Patent
Sunter

(10) Patent No.: US 11,455,447 B2
(45) Date of Patent: Sep. 27, 2022

(54) ACTIVITY COVERAGE ASSESSMENT OF CIRCUIT DESIGNS UNDER TEST STIMULI

(71) Applicant: Siemens Industry Software Inc., Plano, TX (US)

(72) Inventor: Stephen Kenneth Sunter, Nepean (CA)

(73) Assignee: Siemens Industry Software Inc., Plano, TX (US)

(*) Notice: Subject to any disclaimer, the term of this patent is extended or adjusted under 35 U.S.C. 154(b) by 827 days.

(21) Appl. No.: 16/321,929

(22) PCT Filed: Jul. 31, 2017

(86) PCT No.: PCT/US2017/044634
§ 371 (c)(1),
(2) Date: Jan. 30, 2019

(87) PCT Pub. No.: WO2018/026696
PCT Pub. Date: Feb. 8, 2018

(65) Prior Publication Data
US 2019/0179987 A1   Jun. 13, 2019

Related U.S. Application Data

(60) Provisional application No. 62/369,165, filed on Jul. 31, 2016.

(51) Int. Cl.
*G06F 30/30* (2020.01)
*G01R 31/3183* (2006.01)
(Continued)

(52) U.S. Cl.
CPC .. *G06F 30/3308* (2020.01); *G01R 31/318357* (2013.01); *G06F 30/33* (2020.01); *G06F 30/367* (2020.01); *G06F 30/38* (2020.01)

(58) Field of Classification Search
CPC ............... G06F 30/30–398; G01R 31/318357
See application file for complete search history.

(56) References Cited

U.S. PATENT DOCUMENTS

| | | | | |
|---|---|---|---|---|
| 7,643,979 B2 * | 1/2010 | Hong | .................... | G06F 30/367 703/14 |
| 8,407,035 B2 * | 3/2013 | Aarts | .................... | G06F 30/33 703/13 |

(Continued)

OTHER PUBLICATIONS

N.B. Hamida et al., "LIMSoft: Automated Tool for Design and Test Integration of Analog Circuits," 1996 IEEE International Test Conference, Paper 21.2, pp. 571-580. (Year: 1996).*

(Continued)

*Primary Examiner* — Leigh M Garbowski

(57) ABSTRACT

Aspects of the disclosed technology relate to techniques of activity coverage assessment. Transistor-level circuit simulation is performed for a circuit design under a set of test stimuli, which determines values of one or more electrical properties for each of circuit elements of interest in the circuit design. The one or more electrical properties are selected based on information of the each of circuit elements of interest, which comprises what circuit element type the each of circuit elements of interest belongs to. Based on the values of the one or more electrical properties, activity coverage information comprising information about which circuit elements in the circuit elements of interest are active or inactive under the set of test stimuli is determined.

30 Claims, 4 Drawing Sheets

(51) Int. Cl.
*G06F 30/3308* (2020.01)
*G06F 30/33* (2020.01)
*G06F 30/367* (2020.01)
*G06F 30/38* (2020.01)

(56) References Cited

U.S. PATENT DOCUMENTS

| | | | |
|---|---|---|---|
| 10,657,208 B2* | 5/2020 | Han | G06F 30/3323 |
| 10,719,645 B1* | 7/2020 | Zhang | G06F 11/3608 |
| 2013/0054161 A1 | 2/2013 | Hapke et al. | |
| 2013/0326472 A1* | 12/2013 | Han | G06F 8/10 |
| | | | 717/105 |
| 2014/0059507 A1 | 2/2014 | Sunter | |

OTHER PUBLICATIONS

S. Sunter et al., "Practical random sampling of potential defects for analog fault simulation," 2014 IEEE International Test Conference, Paper 2.3, pp. 1-10. (Year: 2014).*

J.P. Shen et al., "Inductive Fault Analysis of MOS Integrated Circuits," 1985 IEEE Design & Test, pp. 13-26. (Year: 1985).*

Anonymous: Capacitor—Wikipedia, the free encyglopedia, Dec. 24, 2010 XP055231648 Retrieved from the internet: URL:https//en.wikipedia.org/w/index.php?title = Capacitor&oldid=403955507 (retrieved on Nov. 26, 2015), pp. 1-16.

Anonymous: "Eldo User's Manual Software Version 6.6_1 Release 2005.3" Dec. 31, 2005, XP055416454, Retrieved from the iNternet: URL:www.engr.uky.edu/~elias/tutorials/eldo/eldo_ur.pdf retrieved on Oct. 17, 2017, pp. 10-258.

Anonymous: "Inductor-Wikipedia", Jan. 5, 2013, XP055310056, Retrieved from the internet: URL:https://en.wikipedia.org/w/index.php?titele= inductor&oldid=531498039 (retrieved on Oct. 12, 2016), pp. 1-16.

Manoj Sachdev. et al.:"Defect-Oriented Analog Testing", Dec. 31, 2007 XP055416431, ISBN:978-0-387-46547-0 Retrieved from Internet_ URL: http://www.springer.com/de/book/9780387465463(retrieved an Oct. 17, 2017) pp. 237-238.

PCT International Search Report and Written Opinion of International Searching Authority dated Nov. 13, 2017 corresponding to PCT International Application No. PCT/US2017/044634 filed Jul. 31, 2017.

* cited by examiner

ACTIVITY COVERAGE ASSESSMENT OF CIRCUIT DESIGNS UNDER TEST STIMULI

RELATED APPLICATIONS

This application claims the benefit of U.S. Provisional Patent Application No. 62/369,165, filed on Jul. 31, 2016, and naming Stephen Kenneth Sunter as inventor, which application is incorporated entirely herein by reference.

FIELD OF THE DISCLOSED TECHNOLOGY

The disclosed technology relates to the field of circuit simulation and fault simulation in analog, mixed-signal, and digital circuits. Various implementations of the disclosed technology may be particularly useful for determining whether potential defect sites in a circuit design would be activated by a set of stimulus signals.

BACKGROUND OF THE DISCLOSED TECHNOLOGY

In the electronics industry, the fault coverage for a manufacturing test of a circuit is an important metric. If the fault coverage is less than 100%, the test may miss some defects in a circuit, which could cause failures when the circuit is used. The fault coverage percentage can be used to predict the percentage of all circuits shipped that are likely to be defective. The predicted result allows an economic analysis of whether testing should be increased (which would increase test cost), or whether testing could be reduced (to reduce test cost) without significantly reducing the number of defective devices that escape the test.

The fault coverage can be assessed based on the degree to which a set of stimulus signals stimulate a circuit under test. The stimulation degree typically represents an upper bound of the fault coverage because detecting a fault requires not only fault activation but also fault effect propagation to observation points. One such method widely used for digital circuits is based on determining the percentage of nodes toggling. Here, toggling is defined as a logic 0-to-1 or 1-to-0 signal transition occurring at the node. The test cannot detect either a stuck-at-1 fault or a stuck-at-0 fault on any circuit node that does not toggle, regardless of which of the circuit's outputs are observed during the test. A toggle percentage less than 100% dictates that the fault coverage is less than 100%.

An advantage of the toggle coverage metric is that it can be measured while performing functional simulation during design verification. No time-consuming fault simulation is needed, and no test limits are needed for performance measurement. Fault simulation is a term used to describe systematic injection of models of potential faults that might be caused by defects during a manufacturing process. As such, most present digital simulators report the toggle coverage by default.

Toggle coverage can also be measured for analog circuits. Transistor-level simulation, using SPICE-based simulators such as Mentor Graphics' Eldo, can report occurrence of "activity" at every circuit node. Eldo defines activity as the node's voltage changing by at least a minimum amount such as 0.1 volts. The nodes at which no activity occurred are also reported, allowing the toggle coverage percentage to be calculated. Similar to how toggle is monitored for digital circuits, activity can be monitored while performing functional simulation, without relying on time-consuming fault simulation.

Monitoring voltage changes, as a metric for circuit activity or fault coverage, has shortcomings, however. Some node voltages are not expected to change, including DC biases (from voltage references or to constant current sources), signal grounds (at a DC voltage mid-way between the DC power rail voltages), and virtual grounds (maintained at a constant voltage by an op-amp's negative feedback); some signals are conveyed as currents and cause insignificant voltage changes at most of the nodes through which the signal is conveyed; and some node voltages have a large swing but at a low enough frequency that a resistive-open defect has no effect on the signal propagating to an MOS transistor gate that has very little capacitance. Moreover, while all nodes are considered as equally likely to have a defect, some circuit nodes are more susceptible to defects during manufacturing than other nodes are, such as those of circuit elements that occupy more area in an integrated circuit, nodes that are in closer proximity to other nodes (more likely to have a bridging defect), and paths between nodes that include more inter-layer vias. Furthermore, in a layout-extracted netlist, there are many additional circuit nodes (relative to the original design-intent schematic netlist) connected to DC power rail nodes via resistances of only a few ohms, and these additional nodes will have very small signal swings, typically a few millivolts. It is thus desirable to develop methods for monitoring electrical activity or "toggling" in a transistor-level design more effectively and accurately without increasing simulation time.

BRIEF SUMMARY OF THE DISCLOSED TECHNOLOGY

Aspects of the disclosed technology relate to techniques of activity coverage assessment. In one aspect, there is a method comprising: receiving information of a circuit design; performing transistor-level circuit simulation of the circuit design under a set of test stimuli, the transistor-level circuit simulation determining directly or indirectly values of one or more electrical properties for each of circuit elements of interest in the circuit design, the one or more electrical properties being selected based on information of the each of circuit elements of interest, the information of the each of circuit elements of interest comprising what circuit element type the each of circuit elements of interest belongs to; and storing the values of the one or more electrical properties, wherein the values of the one or more electrical properties are used to determine activity coverage information, the activity coverage information comprising information about which circuit elements in the circuit elements of interest are active or inactive under the set of test stimuli.

The method may further comprise: determining the activity coverage information based on the values of the one or more electrical properties. The activity coverage information may be determined further based on likelihood of occurrence for potential defects associated with the each of circuit elements of interest.

The method may further comprise: determining statistical values of the one or more electrical properties based on the values of the one or more electrical properties; and comparing the statistical values of the one or more electrical properties with predetermined threshold values of the one or more electrical properties to determine the activity coverage information.

The method may further comprise: determining statistical values of the one or more electrical properties based on the values of the one or more electrical properties; comparing the statistical values of the one or more electrical properties with predetermined threshold values of the one or more electrical properties, wherein the results of the comparing for each of the circuit elements of interest that has only one electrical property in the one or more electrical properties are used to determine whether the each of the circuit elements of interest that has only one electrical property in the one or more electrical properties is active or not; and determining whether each of the circuit elements of interest that has two or more electrical properties in the one or more electrical properties is active or not based on a logical combination of the results of the comparing for the each of the circuit elements of interest that has two or more electrical properties in the one or more electrical properties.

The one or more electrical properties may be selected further based on information of potential defects associated with the each of circuit elements of interest. The information of potential defects associated with the each of circuit elements of interest may be determined based at least in part on layout information, properties of the each of circuit elements of interest, or any combination thereof.

The information of the each of circuit elements of interest may further comprise whether the each of circuit elements of interest is a design-intent circuit element or a parasitic circuit element, whether the each of circuit elements of interest is a basic circuit element or a complex circuit element, signal frequencies applied to the each of circuit elements of interest, or any combination thereof.

The circuit elements of interest may comprise all of or a subset of design-intent circuit elements of the circuit design. The subset of design-intent circuit elements of the circuit design may be randomly selected.

The activity coverage information may comprise information about what percentage of the circuit elements of interest are active.

In another aspect, there are one or more non-transitory computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Figure 1:
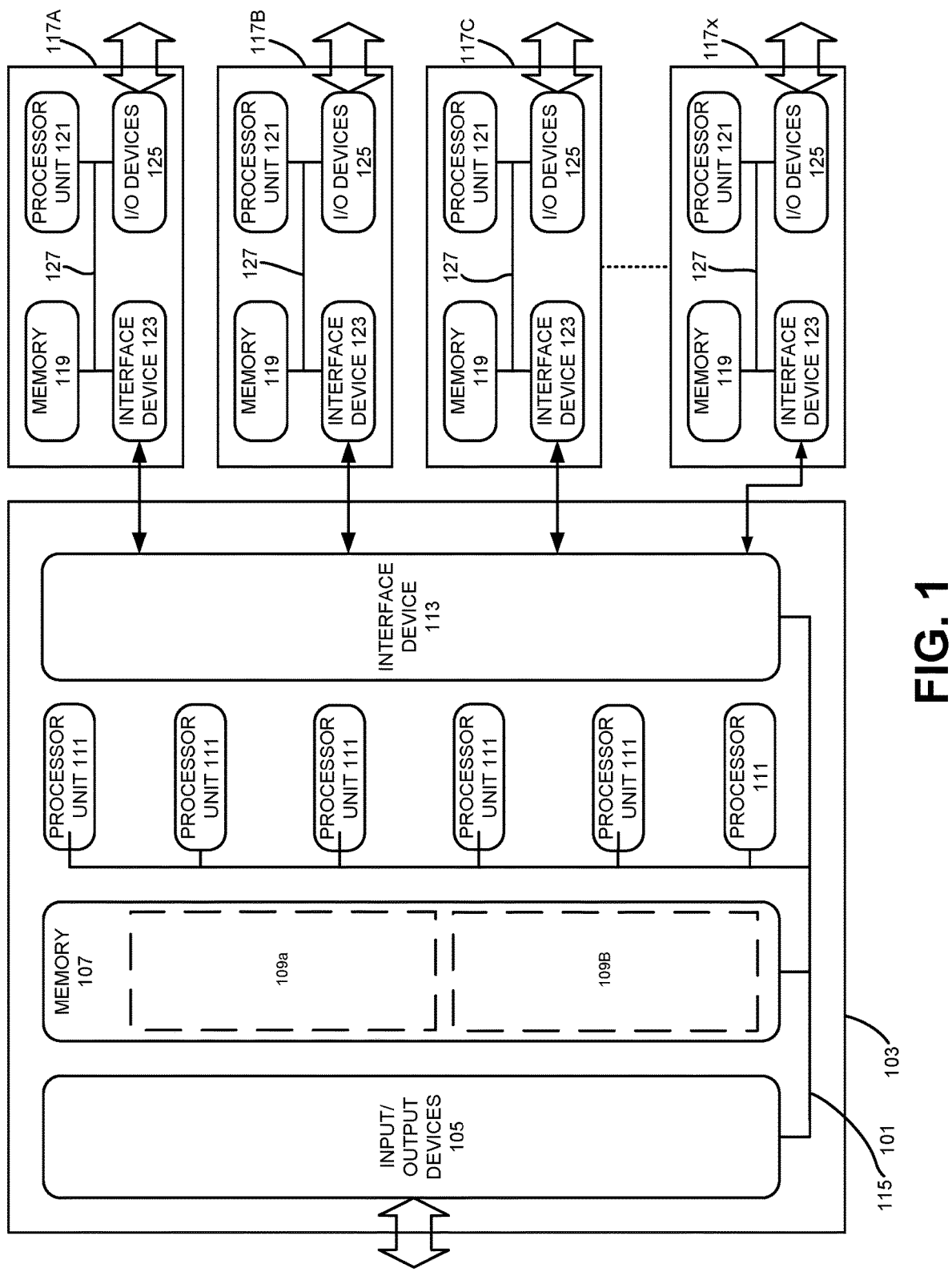
FIG. 1 illustrates an example of a computing system that may be used to implement various embodiments of the disclosed technology.

Various aspects of the present disclosed technology relate to techniques of activity coverage assessment. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform", "determine" and "select" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
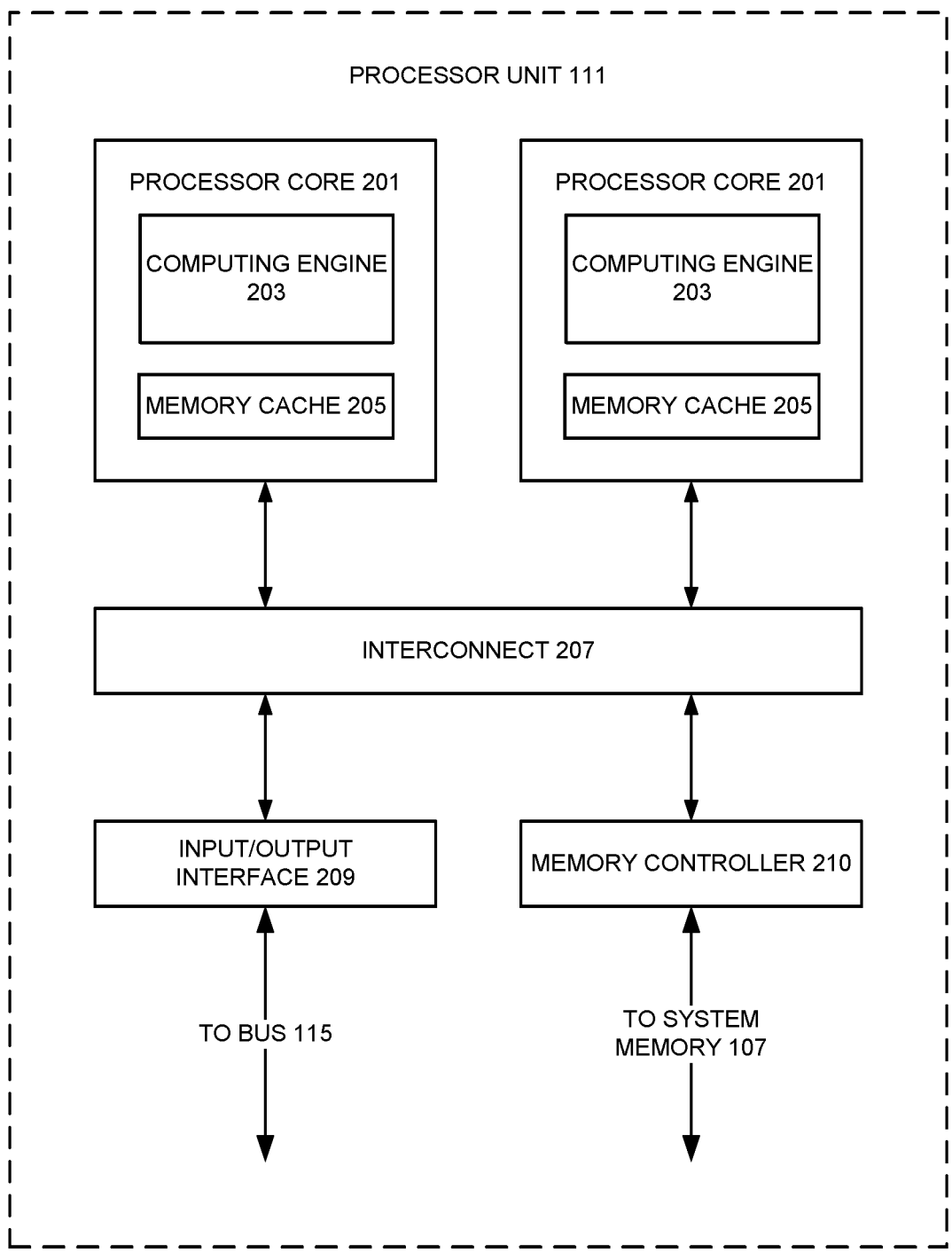
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the disclosed technology, the processor units 201 may include additional components, such as a high-level cache memory accessible shared by the processor cores 201.

While FIG. 2 shows one illustration of a processor unit 201 that may be employed by some embodiments of the disclosed technology, it should be appreciated that this illustration is representative only, and is not intended to be limiting. For example, some embodiments of the disclosed technology may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Activity Coverage Assessment Tool

Figure 3:
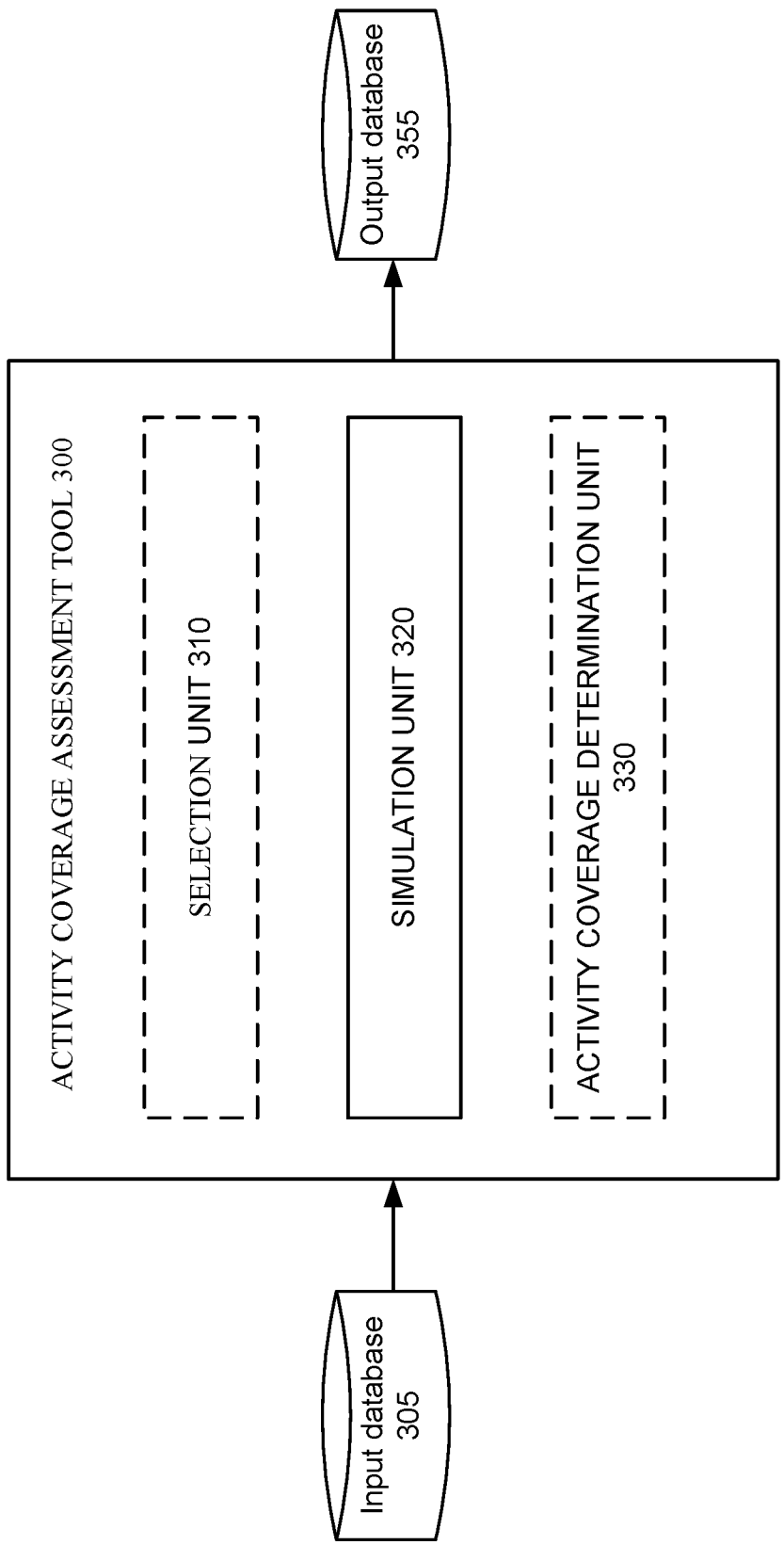
FIG. 3 illustrates an example of an activity coverage assessment tool that may be employed according to various embodiments of the disclosed techniques.

FIG. 3 illustrates an example of an activity coverage assessment tool 300 according to various embodiments of the disclosed technology. As seen in this figure, the activity coverage assessment tool 300 includes a simulation unit 320. Some implementations of the activity coverage assessment tool 300 may cooperate with (or incorporate) one or more of a selection unit 310, an activity coverage determination unit 330, an input database 305 and an output database 355.

As will be discussed in more detail below, the activity coverage assessment tool 300 can receive information of a circuit design from the input database 305. The selection unit 310 can select one or more electrical properties for each of circuit elements of interest in the circuit design based on information of the each of circuit elements of interest. The circuit elements of interest may comprise all of or a subset of functional circuit elements of the circuit design. The simulation unit 320 can perform transistor-level circuit simulation of the circuit design under a set of test stimuli. The transistor-level circuit simulation determines values of the one or more electrical properties for each of the circuit elements of interest. The activity coverage determination unit 330 can determine activity coverage information based on the values of the one or more electrical properties. The activity coverage assessment tool 300 can store the values of the one or more electrical properties and the activity coverage information in the output database 355.

As previously noted, various examples of the disclosed technology may be implemented by one or more computing systems, such as the computing system illustrated in FIGS. 1 and 2. Accordingly, one or more of the selection unit 310, the simulation unit 320, and the activity coverage determination unit 330 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the selection unit 310, the simulation unit 320, and the activity coverage determination unit 330. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the selection unit 310, the simulation unit 320, and the activity coverage determination unit 330 are shown as separate units in FIG. 3, a single computer (or a single processor within a master computer) or a single computer system may be used to implement all of these units at different times, or components of these units at different times.

With various examples of the disclosed technology, the input database 305 and the output database 355 may be implemented using any suitable computer readable storage device. That is, either of the input database 305 and the output database 355 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 305 and the output database 355 are shown as separate units in FIG. 3, a single data storage medium may be used to implement some or all of these databases.

Activity Coverage Assessment

Figure 4:
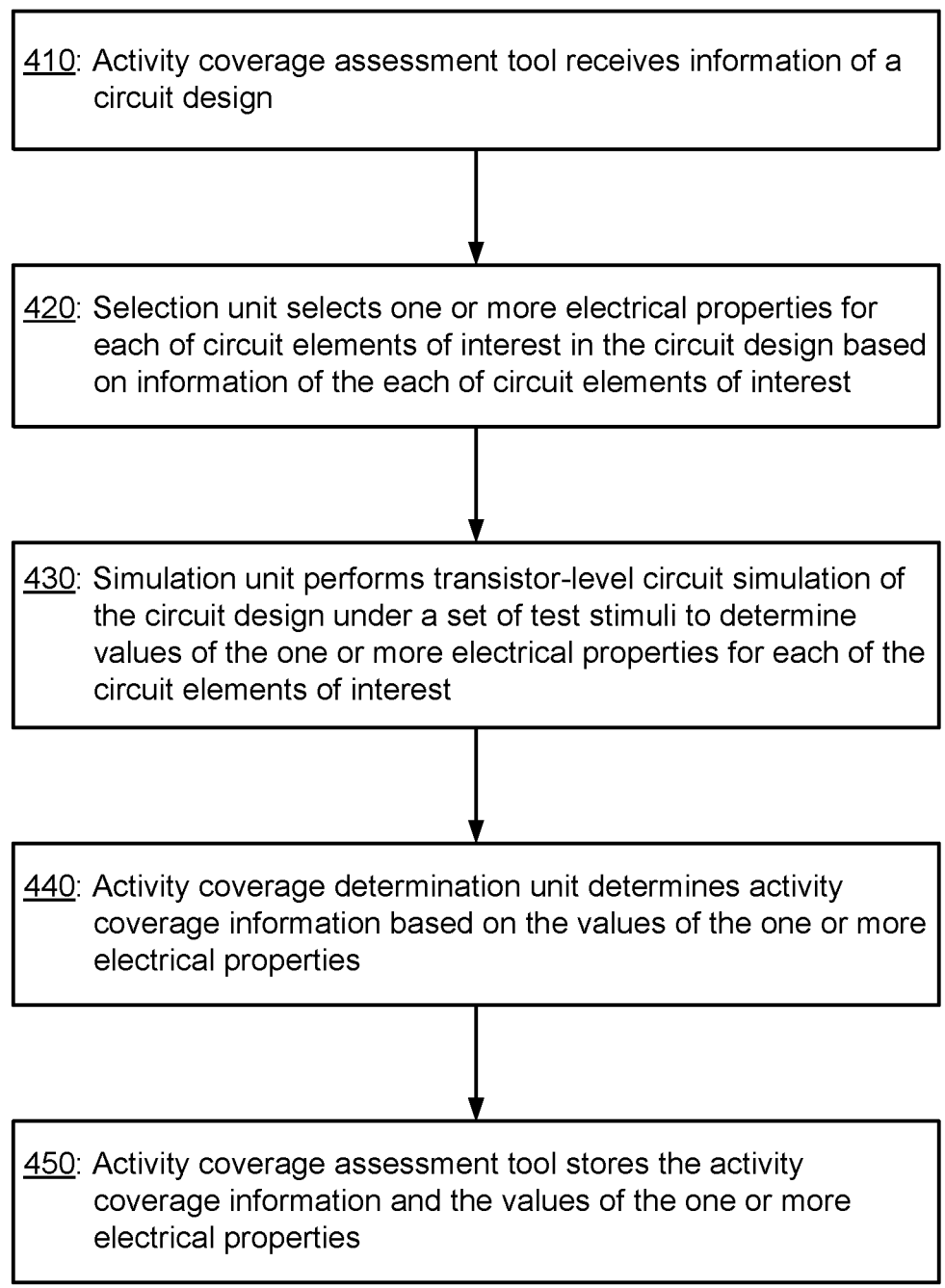
FIG. 4 illustrates an example of a flowchart showing a process of activity coverage assessment that may be implemented according to various examples of the disclosed technology.

FIG. 4 illustrates a flowchart 400 showing a process of activity coverage assessment that may be implemented according to various examples of the disclosed technology. For ease of understanding, methods of activity coverage assessment that may be employed according to various embodiments of the disclosed technology will be described with reference to the activity coverage assessment tool 300 in FIG. 3 and the flow chart 400 illustrated in FIG. 4. It should be appreciated, however, that alternate implementations of an activity coverage assessment tool may be used to perform the methods of activity coverage assessment illustrated by the flow chart 400 according to various embodiments of the disclosed technology. Likewise, the activity coverage assessment tool 400 may be employed to perform other methods of activity coverage assessment according to various embodiments of the disclosed technology.

In operation 410, the activity coverage assessment tool 300 receives information of a circuit design. The information of a circuit design may be retrieved from the input database 305. The circuit design may be represented by a netlist. The netlist may be derived from a schematic diagram that represents design intent, or it may be extracted from a physical layout which includes the design-intent circuitry and unintended parasitic resistances, capacitances, inductances, or any combination thereof.

In operation 420, the selection unit 310 selects one or more electrical properties for each of circuit elements of interest in the circuit design based on information of the each of circuit elements of interest. The circuit elements of interest may comprise all of or a subset of functional circuit elements of the circuit design. The circuit elements of interest may further comprise parasitic circuit elements extracted from the physical layout. The selection unit 310 can select the subset of functional circuit elements randomly or based on one or more criteria provided by a user.

The one or more electrical properties of a circuit element may comprise voltage across two of the nodes of the circuit element, current through a node of the circuit element, a derivative of voltage with respect to time across two of the nodes of the circuit element, a derivative of current with respect to time through a node of the circuit element, or any combination thereof. The selection unit 310 selects electrical properties for each of the circuit elements of interest based, at least in part, on the information of the each of circuit elements of interest comprising what circuit element type the each of circuit elements of interest belongs to. The information of the each of circuit elements of interest may further comprise whether the each of circuit elements of interest is a design-intent circuit element or a parasitic circuit element, whether the each of circuit elements of interest is a basic circuit element or a complex circuit element, signal frequencies applied to the each of circuit elements of interest, or any combination thereof.

Information of potential defects associated with the each of circuit elements of interest may also be considered when selecting the electrical properties. Potential defect types include but are not limited to the following: a short across two nodes of the circuit element, an open in one of the circuit element nodes, an increase in a principal electrical parameter of the circuit element, a decrease in a principal parameter of the circuit element, and a change in the circuit element's transfer function. The information of potential defects may be determined based at least in part on layout information, properties of the each of circuit elements of interest, or any combination thereof.

Table 1 illustrates an example of electrical properties that may be selected for various types of circuit elements and various types of defects that may be implemented according to various embodiments of the disclosed technology.

TABLE 1

| Circuit element type | Potential defect type | Electrical property monitored |
| --- | --- | --- |
| Design-intent resistor | Variation in resistance | Voltage across the resistor |
| Parasitic resistor | Open circuit in series | Current through the resistor; dv/dt at one node of the resistor |
| Design-intent capacitor | Variation in capacitance | Current through the capacitor, the current equals Cdv/dt |
| Parasitic capacitor | Short circuit in parallel | Voltage across the capacitor |
| Design-intent inductor | Variation in inductance | Voltage across the inductor; the voltage equals Ldi/dt |
| Parasitic inductor | Open circuit in series | Current through the inductor |
| Diode | Variation in knee voltage | Current through the diode |
| Diode | Open circuit in series | Current through the diode |
| Diode | Short circuit in parallel | Voltage across the diode |
| MOS transistor | Variation in threshold or gain | Current through source or drain |

TABLE 1-continued

| Circuit element type | Potential defect type | Electrical property monitored |
|---|---|---|
| MOS transistor | Stuck off | Current through source or drain |
| MOS transistor | Stuck on | dv/dt across source and drain |
| Bipolar transistor | Variation in threshold or gain | di/dt through emitter |
| Bipolar transistor | Open in base or emitter | Current through emitter |
| Complex circuit elements | Any | Current through port nodes, and di/dt; Voltage at port nodes, and dv/dt. |

If the voltage across a design-intent resistor is almost zero, then a defect that causes as much as 90% change in the resistance is likely to be undetectable. Parasitic resistances are usually only a few ohms, and for 1 milliampere of current, the voltage across them will therefore be only a few millivolts. Accordingly, the current should be monitored for these resistors. If an open circuit resistance of, for example, 100 megohms is inserted in series with an MOS transistor gate, it won't have any measurable effect unless the gate voltage changes very quickly. For this reason, the derivative of the voltage at either node of the resistor may be monitored in addition to the current.

The voltage across a capacitor could be near zero for high frequencies, but the current through it might be significant and should be monitored. If the AC current through a capacitor is almost zero, then a defect that causes as much as 90% change in the capacitance is likely to be undetectable. AC current through a capacitor is equal to its capacitance multiplied by the time derivative of the voltage across the capacitor, Cdv/dt; DC current (for which dv/dt=0) through a capacitor will always be zero. A short circuit across a parasitic capacitance is unlikely to be detected if the voltage across the capacitance is always almost zero.

The current through an inductor might be almost zero for high frequencies, but the voltage across it might be significant and should be monitored. If the AC voltage across an inductor is almost zero, then a defect that causes as much as 90% change in the inductance is likely to be undetectable. AC voltage across an inductor is equal to its inductance multiplied by the time derivative of the current through the inductor Ldi/dt; DC voltage (for which di/dt=0) across an inductor will always be zero. An open circuit in a parasitic inductance is unlikely to be detected if the current through the inductance is always almost zero.

When current flows through a diode, the voltage across the diode depends on whether the voltage is positive or negative, corresponding to forward or reverse biased. For example, if the voltage is positive, the current will be almost zero unless the voltage exceeds 0.7 volts; if the voltage is negative, the current will be almost zero unless it exceeds the reverse breakdown voltage of the diode, especially for zener diodes. If the diode current is always almost zero, then neither the forward nor the reverse voltage "knees" have been exceeded, and variation in the knee voltage or an open circuit will be very likely undetectable; it is not sufficient to monitor either node's voltage or the voltage across the diode because detectability depends which way the diode is biased and the knee voltages for the specific diode. For assessing detectability of potential shorts, the current might be zero because there is no voltage applied across the diode, or because the applied voltage is below the voltage knee; for this reason the voltage across the diode may be monitored to determine whether a short circuit would be undetectable.

Metal-oxide-semiconductor field-effect transistors (MOS FETs) typically have four nodes, denoted as drain, gate, source, and bulk substrate. Physically there is no difference between the source and drain (they are interchangeable). Only when current flows through the source and drain nodes of a transistor can variations in its principal parameters be detected. If a transistor is turned off, then any such variations will have no effect, and a stuck-off fault cannot be detected either. If significant current is flowing, a defect that causes the transistor to be stuck on (for example, if the gate is shorted to a power rail) might not be distinguishable from fault-free operation because the transistor is normally always on—the most common case is a DC bias voltage generating circuit. There must be changes in voltage across at least two of the transistor's terminals to be able to detect whether the transistor is acting as a transistor. In many cases, the source and drain are connected intentionally, so monitoring the source-drain voltage is a more reliable indicator of defect detectability.

Bipolar transistors typically have 3 nodes, denoted as emitter, base, and collector. The most common defects are opens in the base or emitter, since these are physically the smallest portions of the transistor; either of these will result in almost zero current flowing through the emitter. If the collector is open, current could still flow from base to emitter, so collector current could be monitored too. Transistor nodes that are simply conducting current are not likely to indicate defective variations in the principal parameters of a transistor—variations in the emitter current need to occur.

Accessible port nodes of arbitrarily complex circuits, such as amplifiers, data converters, "black box" models, and ICs, can be monitored similarly to the basic circuit elements. In general, many nodes don't "toggle" in voltage sufficiently to reliably indicate that they are inactive, so current is a more reliable electrical property to monitor. Port nodes having an input or output capacitance will convey current when their voltage toggles, and also when the node is active but has no significant voltage change; for example the output of a voltage regulator. To monitor the current at a port node, it might be necessary to insert a virtual zero-volt voltage supply at the node, and monitor current through it. For circuits that are sensitive to the frequency of stimulus signals, the derivative of the current or voltage is more indicative of sufficient activity. Thus, a port node could be declared active if its current exceeds a threshold value or its voltage changes more than a threshold value within a short time interval.

In operation 430 of the flowchart 400, the simulation unit 320 performs transistor-level simulation of the circuit design under a set of test stimuli. The simulation unit 320 may be implemented using various simulation tools such as those in the Eldo family of software tools available from Mentor Graphics Corporation, A Siemens Business, Wilsonville, Oreg. The transistor-level simulation determines directly or indirectly values of the selected one or more electrical properties for each of circuit elements of interest. If a chosen electrical property cannot be monitored directly by the simulator, then related electrical properties are monitored. After the simulation, the chosen electrical properties are calculated based on the monitored related electrical properties. A practical alternative to monitoring the derivative of voltage or current with respect to time is monitoring the change in voltage or current at the circuit output sampling times, since that time interval is usually indicative of the frequencies occurring within the circuit. For example, if the output is sampled once every cycle of a master clock signal, then node voltages can be sampled at these same time instants, and changes between consecutive instants measured instead of the derivative.

In operation 440 of the flowchart 400, the activity coverage determination unit 330 determines activity coverage information based on the values of the one or more electrical properties. The activity coverage information comprises information about which circuit elements in the circuit elements of interest are active or inactive under the set of test stimuli. With various implementations of the disclosed technology, the activity coverage determination unit 330 first computes statistical values of the one or more electrical properties based on the values of the one or more electrical properties. The statistical properties may include but are not limited to: average value, unsigned average value (absolute average value), maximum value, maximum absolute value, average change in value, maximum change in value. In some embodiments of the disclosed technology, the statistical properties are one or two of the following: maximum absolute value of the voltage, for any sample of the voltage; maximum absolute value of the current, for any sample of the current; maximum absolute value of the change in the voltage, between any two consecutive samples of the voltage; and maximum absolute value of the change in the current, between any two consecutive samples of the current.

These statistical property values associated with each circuit element of interest can be compared with predetermined threshold values, which can set by a user or have default threshold values. Examples of the default threshold values are the absolute values of: voltage across circuit element nodes: 100 millivolts; current through circuit element nodes: 1 microamp; dv/dt: 1 millivolt change per output sampling time-step; and di/dt: 10 nanoampere change per output sampling time-step. The threshold value for a monitored electrical property being declared active or inactive is typically circuit dependent. Circuits that operate with power rail voltages above 3.3V might have a threshold for activity set to 0.5 volts, whereas one that operates with power rail voltages less than 1.0 volt might have an activity threshold of 0.1 volt. When determining activity during a stress test, an example default threshold value for the absolute value of voltage across circuit element nodes is half the power rail voltage.

The comparison results can be used to determine whether the circuit elements of interest are active or not. For a circuit element of interest that has only one electrical property, a single statistical property may be used to determine the activity according to some embodiments of the disclosed technology: if the statistical property exceeds the threshold value, the circuit element is declared active, otherwise it is declared inactive. For a circuit element of interest that has two or more electrical properties, a logical combination of statistical properties may be used to determine the activity according to some embodiments of the disclosed technology. For example, only if both of two electrical properties for a circuit element exceed their respective thresholds is the circuit element declared active.

In addition to the information about which circuit elements in the circuit elements of interest are active or inactive under the set of test stimuli, the activity coverage information may further comprise information about what percentage of the circuit elements of interest are active. Each circuit element may be considered as a potential defect site. The percentage of the circuit elements of interest that are active can be used to estimate maximum achievable defect coverage for the set of stimuli, or at least identify the potential defect sites for which more activation is needed. The estimated defect coverage based only on monitoring electrical properties during simulation of tests applied to a defect-free circuit will usually be within 25% of the defect coverage measured by simulating each possible defect. To be detectable, a defect must be controllable (activated), and observable via a primary output of the circuit. For example, if defect coverage is 70%, then 30% of defects are not detected. In this case, all of the detected defects might be at active sites, but only half of the undetected defects (i.e., 15%) might be at inactive circuit elements while the remaining undetected defects might be undetected because they do not affect an output result. Thus the percentage of nodes reported as active might be reported as 70%+15%=85%. The activity coverage information can indicate whether the test stimulus needs to be improved.

In addition to being determined based on the values of the one or more electrical properties, the activity coverage information may be determined further based on likelihood of a defect at each potential defect site. It is sometimes possible to calculate a likelihood of occurrence for each defect, based on global likelihoods for each defect type, and properties of each circuit element instance. For example, shorts might be twice as likely as opens, and larger transistors, that have a greater length times width, might be more susceptible to defects that smaller transistors.

The physical layout may be analyzed to identify potential defect sites, and to serve as a basis for estimating defect likelihood. Defect sites might be identified that are not evident in the extracted circuit netlist, such as adjacent geometries that are susceptible to short circuits but for which a parasitic capacitance was not extracted. Conversely, the adjacencies associated with some parasitic capacitances might be ignored. Adjacent geometries that are found but which do not correspond to a parasitic capacitance in the circuit netlist can be treated as virtual capacitors, with zero capacitance, connected between two nodes, one node associated with each of the adjacent geometries.

The likelihood of a defect at each potential defect site may be used to weight the calculation of the activity coverage. According to some embodiments of the disclosed technology, the likelihood-weighted activity coverage is equal to the sum of likelihoods for all active circuit elements divided by the sum of the likelihoods of all circuit elements whose activity is assessed. For an example circuit containing a resistor with likelihood of an open equal to 0.01, a capacitor with likelihood of a short equal to 0.02, a transistor with likelihood of being stuck on being equal to 0.05, and only the resistor and capacitor were declared as active, then activity coverage would be calculated as (0.01+0.02)/(0.01+0.02+0.05)=0.375 or 37.5%.

In operation 450 of the flowchart 400, the activity coverage assessment tool 300 stores the values of the one or more electrical properties and the activity coverage information. The database 355 may be used for the storage. The activity coverage assessment tool 300 may also report the information on a computer screen or other media.

Various implementations of the disclosed technology can detect activity on nodes that are not expected to significantly change in voltage but are actively delivering a current, and/or a resistive-open defect occurring in series with an MOS gate that requires signal frequencies high enough for the resistive-open to be detectable. The disclosed technology can be applied to any circuit design, analog, mixed-signal, or digital, and can be suitable for schematic netlists, layout-extracted netlists, and any combination of these. It can guide improvements to defect coverage without simulating any injected defects. It can also guide improvements to stimuli that are intended to prematurely stress a circuit, in which the stress is intended to cause slightly defective circuit elements to become fully defective. The disclosed methods, apparatus, and systems, however, are not limited to any specific aspect or feature or combination thereof, nor do the disclosed embodiments require that any one or more specific advantages be present or problems be solved.

CONCLUSION

Having illustrated and described the principles of the disclosed technology, it will be apparent to those skilled in the art that the disclosed embodiments can be modified in arrangement and detail without departing from such principles. For example, any one or more aspects of the disclosed technology can be applied in other embodiments. In view of the many possible embodiments to which the principles of the disclosed technologies can be applied, it should be recognized that the illustrated embodiments are only preferred examples of the technologies and should not be taken as limiting the scope of the disclosed technology.

What is claimed is:

1. A method, executed by at least one processor of a computer, comprising:
   receiving information of a circuit design;
   performing transistor-level circuit simulation of the circuit design under a set of test stimuli, the transistor-level circuit simulation determining directly or indirectly values of one or more electrical properties for each of circuit elements of interest in the circuit design, the one or more electrical properties being selected based on information of the each of circuit elements of interest, the information of the each of circuit elements of interest comprising what circuit element type the each of circuit elements of interest belongs to;
   determining statistical values of the one or more electrical properties based on the values of the one or more electrical properties; and
   storing the statistical values of the one or more electrical properties, wherein the statistical values of the one or more electrical properties are used to determine activity coverage information, the activity coverage information comprising information about which circuit elements in the circuit elements of interest are active or inactive under the set of test stimuli.

2. The method recited in claim 1, wherein the activity coverage information is determined further based on likelihood of occurrence for potential defects associated with the each of circuit elements of interest.

3. The method recited in claim 1, further comprising:
   comparing the statistical values of the one or more electrical properties with predetermined threshold values of the one or more electrical properties to determine the activity coverage information.

4. The method recited in claim 1, further comprising:
   comparing the statistical values of the one or more electrical properties with predetermined threshold values of the one or more electrical properties, wherein the results of the comparing for each of the circuit elements of interest that has only one electrical property in the one or more electrical properties are used to determine whether the each of the circuit elements of interest that has only one electrical property in the one or more electrical properties is active or not; and
   determining whether each of the circuit elements of interest that has two or more electrical properties in the one or more electrical properties is active or not based on a logical combination of the results of the comparing for the each of the circuit elements of interest that has two or more electrical properties in the one or more electrical properties.

5. The method recited in claim 1, wherein the one or more electrical properties are selected further based on information of potential defects associated with the each of circuit elements of interest.

6. The method recited in claim 5, wherein the information of potential defects associated with the each of circuit elements of interest is determined based at least in part on layout information, properties of the each of circuit elements of interest, or any combination thereof.

7. The method recited in claim 1, wherein the information of the each of circuit elements of interest further comprises whether the each of circuit elements of interest is a design-intent circuit element or a parasitic circuit element, whether the each of circuit elements of interest is a basic circuit element or a complex circuit element, signal frequencies applied to the each of circuit elements of interest, or any combination thereof.

8. The method recited in claim 1, wherein the circuit elements of interest comprise all of or a subset of design-intent circuit elements of the circuit design.

9. The method recited in claim 8, wherein the subset of design-intent circuit elements of the circuit design is randomly selected.

10. The method recited in claim 1, wherein the activity coverage information comprises information about what percentage of the circuit elements of interest are active.

11. One or more non-transitory computer-readable media storing computer-executable instructions for causing one or more processors to perform a method, the method comprising:
    receiving information of a circuit design;
    performing transistor-level circuit simulation of the circuit design under a set of test stimuli, the transistor-level circuit simulation determining directly or indirectly values of one or more electrical properties for each of circuit elements of interest in the circuit design, the one or more electrical properties being selected based on information of the each of circuit elements of interest, the information of the each of circuit elements of interest comprising what circuit element type the each of circuit elements of interest belongs to;
    determining statistical values of the one or more electrical properties based on the values of the one or more electrical properties; and
    storing the statistical values of the one or more electrical properties, wherein the statistical values of the one or more electrical properties are used to determine activity coverage information, the activity coverage information comprising information about which circuit elements in the circuit elements of interest are active or inactive under the set of test stimuli.

12. The one or more non-transitory computer-readable media recited in claim 11, wherein the activity coverage information is determined further based on likelihood of occurrence for potential defects associated with the each of circuit elements of interest.

13. The one or more non-transitory computer-readable media recited in claim 11, wherein the method further comprises:
    comparing the statistical values of the one or more electrical properties with predetermined threshold values of the one or more electrical properties to determine the activity coverage information.

14. The one or more non-transitory computer-readable media recited in claim 11, wherein the method further comprises:
    comparing the statistical values of the one or more electrical properties with predetermined threshold values of the one or more electrical properties, wherein the results of the comparing for each of the circuit elements of interest that has only one electrical property in the one or more electrical properties are used to determine whether the each of the circuit elements of interest that has only one electrical property in the one or more electrical properties is active or not; and
    determining whether each of the circuit elements of interest that has two or more electrical properties in the one or more electrical properties is active or not based on a logical combination of the results of the comparing for the each of the circuit elements of interest that has two or more electrical properties in the one or more electrical properties.

15. The one or more non-transitory computer-readable media recited in claim 11, wherein the one or more electrical properties are selected further based on information of potential defects associated with the each of circuit elements of interest.

16. The one or more non-transitory computer-readable media recited in claim 15, wherein the information of potential defects associated with the each of circuit elements of interest is determined based at least in part on layout information, properties of the each of circuit elements of interest, or any combination thereof.

17. The one or more non-transitory computer-readable media recited in claim 11, wherein the information of the each of circuit elements of interest further comprises whether the each of circuit elements of interest is a design-intent circuit element or a parasitic circuit element, whether the each of circuit elements of interest is a basic circuit element or a complex circuit element, signal frequencies applied to the each of circuit elements of interest, or any combination thereof.

18. The one or more non-transitory computer-readable media recited in claim 11, wherein the circuit elements of interest comprise all of or a subset of design-intent circuit elements of the circuit design.

19. The one or more non-transitory computer-readable media recited in claim 18, wherein the subset of design-intent circuit elements of the circuit design is randomly selected.

20. The one or more non-transitory computer-readable media recited in claim 11, wherein the activity coverage information comprises information about what percentage of the circuit elements of interest are active.

21. A system, comprising:
    one or more processors, the one or more processors programmed to perform a method, the method comprising:
    receiving information of a circuit design;
    performing transistor-level circuit simulation of the circuit design under a set of test stimuli, the transistor-level circuit simulation determining directly or indirectly values of one or more electrical properties for each of circuit elements of interest in the circuit design, the one or more electrical properties being selected based on information of the each of circuit elements of interest, the information of the each of circuit elements of interest comprising what circuit element type the each of circuit elements of interest belongs to;
    determining statistical values of the one or more electrical properties based on the values of the one or more electrical properties; and
    storing the statistical values of the one or more electrical properties, wherein the statistical values of the one or more electrical properties are used to determine activity coverage information, the activity coverage information comprising information about which circuit elements in the circuit elements of interest are active or inactive under the set of test stimuli.

22. The system recited in claim 21, wherein the activity coverage information is determined further based on likelihood of occurrence for potential defects associated with the each of circuit elements of interest.

23. The system recited in claim 21, wherein the method further comprises:
    comparing the statistical values of the one or more electrical properties with predetermined threshold values of the one or more electrical properties to determine the activity coverage information.

24. The system recited in claim 21, wherein the method further comprises:
    comparing the statistical values of the one or more electrical properties with predetermined threshold values of the one or more electrical properties, wherein the results of the comparing for each of the circuit elements of interest that has only one electrical property in the one or more electrical properties are used to determine whether the each of the circuit elements of interest that has only one electrical property in the one or more electrical properties is active or not; and
    determining whether each of the circuit elements of interest that has two or more electrical properties in the one or more electrical properties is active or not based on a logical combination of the results of the comparing for the each of the circuit elements of interest that has two or more electrical properties in the one or more electrical properties.

25. The system recited in claim 21, wherein the one or more electrical properties are selected further based on information of potential defects associated with the each of circuit elements of interest.

26. The system recited in claim 25, wherein the information of potential defects associated with the each of circuit elements of interest is determined based at least in part on layout information, properties of the each of circuit elements of interest, or any combination thereof.

27. The system recited in claim 21, wherein the information of the each of circuit elements of interest further comprises whether the each of circuit elements of interest is a design-intent circuit element or a parasitic circuit element, whether the each of circuit elements of interest is a basic circuit element or a complex circuit element, signal frequencies applied to the each of circuit elements of interest, or any combination thereof.

28. The system recited in claim 21, wherein the circuit elements of interest comprise all of or a subset of design-intent circuit elements of the circuit design.

29. The system recited in claim 28, wherein the subset of design-intent circuit elements of the circuit design is randomly selected.

30. The system recited in claim 21, wherein the activity coverage information comprises information about what percentage of the circuit elements of interest are active.

* * * * *